US008135903B1

(12) United States Patent
Kan

(10) Patent No.: US 8,135,903 B1
(45) Date of Patent: Mar. 13, 2012

(54) NON-VOLATILE SEMICONDUCTOR MEMORY COMPRESSING DATA TO IMPROVE PERFORMANCE

(75) Inventor: Alan Chingtao Kan, Diamond Bar, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 315 days.

(21) Appl. No.: 12/610,129

(22) Filed: Oct. 30, 2009

(51) Int. Cl.
*G06F 12/00* (2006.01)
(52) U.S. Cl. ........................................ 711/103
(58) Field of Classification Search ............ None
See application file for complete search history.

(56) References Cited

U.S. PATENT DOCUMENTS

| 6,145,069 A | 11/2000 | Dye |
| 2008/0126680 A1* | 5/2008 | Lee et al. ........... 711/103 |
| 2008/0141100 A1* | 6/2008 | Kang et al. ......... 714/773 |
| 2008/0172520 A1* | 7/2008 | Lee ..................... 711/103 |
| 2008/0228998 A1 | 9/2008 | Colecchia et al. |
| 2008/0288436 A1 | 11/2008 | Priya |
| 2010/0122016 A1* | 5/2010 | Marotta et al. ..... 711/103 |
| 2010/0226165 A1* | 9/2010 | Kang et al. ......... 365/148 |
| 2010/0246257 A1* | 9/2010 | Ito et al. ............. 365/185.03 |
| 2010/0262755 A1* | 10/2010 | Becker et al. ...... 711/103 |

OTHER PUBLICATIONS

Roberts, D., Kgil, T., Mudge, T., "Using non-volatile memory to save energy in servers", Design, Automation & Test in Europe Conference & Exhibition, Apr. 24, 2009, pp. 743-748.
Samsung, "4Gb Flex-OneNAND M-die", http://www.datasheetdir.com/KFH8GH6U4M+NAND-Flash, Aug. 22, 2007.

* cited by examiner

*Primary Examiner* — Hiep Nguyen

(57) ABSTRACT

A non-volatile semiconductor memory is disclosed comprising a plurality of paired pages, wherein each pair comprises a first page and a second page. A write command is received from a host comprising write data and a write address. The write address is mapped to a physical address of a selected one of the paired memory pages. The write data is compressed to generate compressed data, and when the compressed data fits in one of the pages of the selected pair, the compressed data is stored in the first page and in the second page of the selected pair in an S-mode.

14 Claims, 8 Drawing Sheets

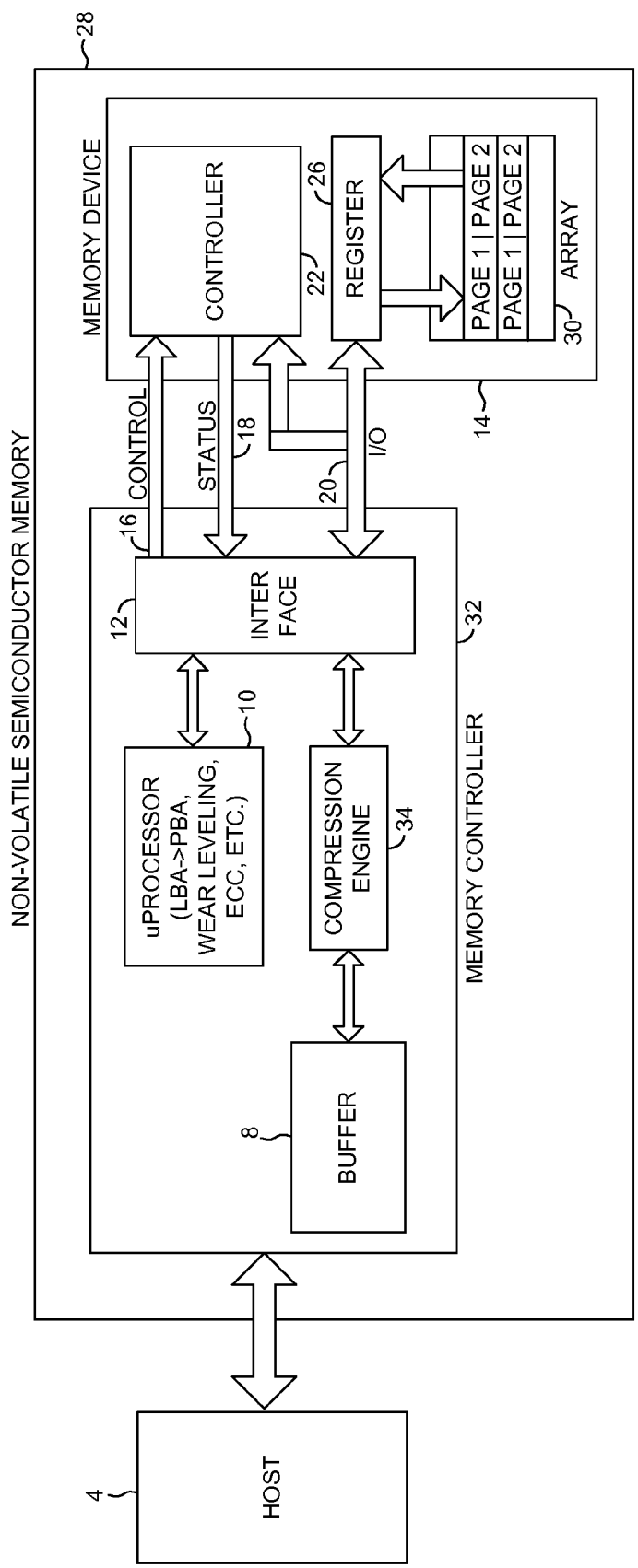
FIG. 2A
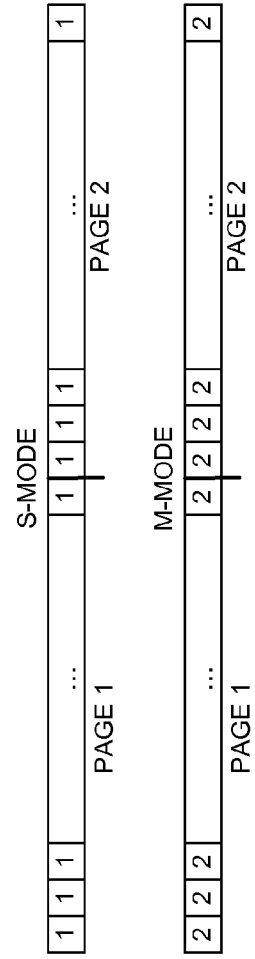
FIG. 2B
FIG. 2C

NON-VOLATILE SEMICONDUCTOR MEMORY COMPRESSING DATA TO IMPROVE PERFORMANCE

BACKGROUND

A non-volatile semiconductor memory may be employed as mass storage for a computer system (e.g., desktop, laptop, portable, etc.) or a consumer device (e.g., music player, cell phone, camera, etc.) or other suitable application. The non-volatile semiconductor memory may comprise one or more memory devices (such as a flash memory) and control circuitry for accessing each memory device. Each memory device is coupled to an I/O bus, as well as a number of interface control lines. When issuing a program command or an erase command to a memory device, the control circuitry transfers the address and command data (and write data for a program operation) over the I/O bus. When issuing a read command, the control circuitry transfers the address and command data over the I/O bus and then receives the read data over the I/O bus.

FIG. 1 shows a prior art non-volatile semiconductor memory 2 communicating with a host 4 according to a suitable communication protocol. A memory controller 6 comprises a buffer 8 for buffering data for write/read commands, and a microprocessor 10 executing control programs for various algorithms, such as a logical block address (LBA) to physical block address (PBA) mapping, wear leveling, error correction code, etc. The memory controller 6 further comprises interface circuitry 12 for interfacing with one or more memory devices 14, such as a suitable flash memory device. The interface circuitry 12 generates suitable control signals 16 and receives status information 18 from the memory device 14 in connection with executing write/read commands initiated by the microprocessor 10. The interface circuitry 12 also transmits and receives data over an I/O bus 20, including read/write data stored in the buffer 8 or command data generated by the microprocessor 10 and transmitted to a controller 22 integrated with the memory device 14.

The memory device 14 comprises an array of memory cells 24 that are accessed in memory segments referred to as pages. During a write operation, write data received over the I/O bus 20 from the buffer 8 is first stored in a data register 26. The controller 22 then transfers the write data from the data register 26 to a target page in the memory array 24. During a read operation, a page in the memory array 24 is read into the data register 26 and then transferred over the I/O bus 20 where it is stored in the buffer 8.

The pages in the memory array 24 may be implemented using single-level cell (SLC) technology wherein each cell stores a single bit, or multi-level cell (M) technology wherein each cell stores multiple bits. Certain brands of M memory devices allow all or part of the pages in the memory array 24 to be configured into an SLC mode. The benefit of SLC over M is improved performance (faster throughput) as well as improved endurance (more erase/program cycles) at the cost of lower capacity (single bit versus multi-bit per cell) leading to a higher price for the same capacity.

BRIEF DESCRIPTION OF THE DRAWINGS

FIG. 2A shows a non-volatile semiconductor memory according to an embodiment of the present invention comprising a compression engine for compressing write data stored in paired pages of a memory device in either an S-mode or a M-mode depending on the size of the compressed data.

FIG. 2B illustrates data stored in paired pages in an S-mode according to an embodiment of the present invention.

FIG. 2C illustrates data stored in paired pages in a M-mode according to an embodiment of the present invention.

DETAILED DESCRIPTION OF EMBODIMENTS OF THE INVENTION

FIG. 2A shows a non-volatile semiconductor memory 28 according to an embodiment of the present invention comprising a plurality of paired pages 30, wherein each pair comprises a first page and a second page. A write command is received from a host 4 comprising write data and a write address. The write address is mapped to a selected one of the paired memory pages. The write data is compressed to generate compressed data, and when the compressed data fits in one of the pages of the selected pair, the compressed data is stored in the first page and in the second page of the selected pair in an S-mode.

Figure 1:
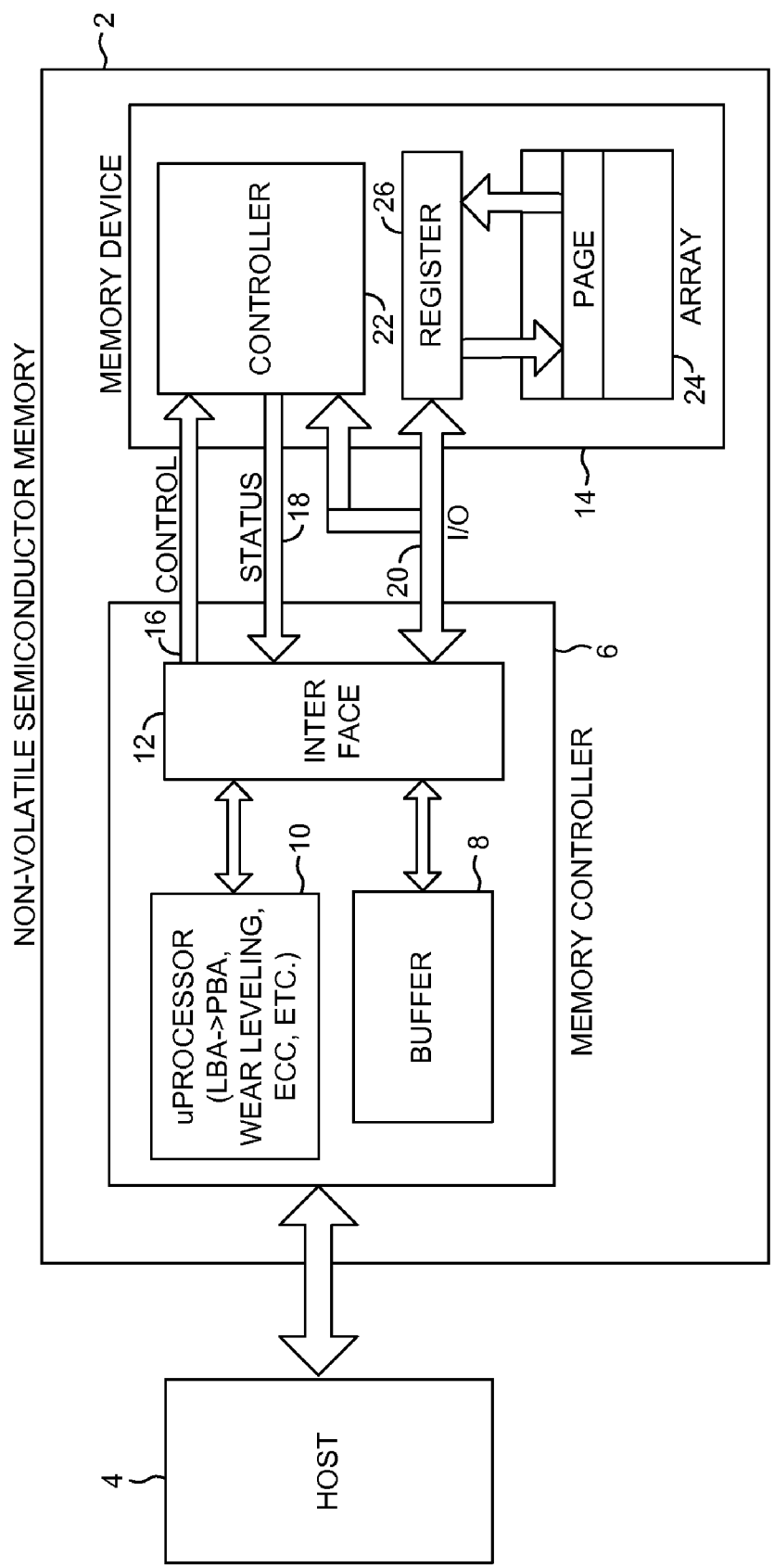
FIG. 1 shows a prior art non-volatile semiconductor memory comprising a memory device and a memory controller.

In the embodiment shown in FIG. 2A, the non-volatile semiconductor memory 28 comprises a memory device 14 (e.g., a flash memory) having a memory array including the paired pages 30. The non-volatile semiconductor memory 28 further comprises control circuitry in the form of a memory controller 32 (e.g., a flash memory controller) including similar components as described above with reference to FIG. 1. The memory controller 32 of FIG. 2A further comprises a compression engine 34 for compressing write data received from the host 4 during write operations, and for decompressing compressed data read from the memory device 14 during read operations.

FIG. 2B illustrates compressed data stored in first and second paired pages in an S-mode wherein each page comprises a plurality of cells and each cell stores a single bit of data. FIG. 2C illustrates compressed data stored in first and second paired pages in a M-mode wherein each cell stores two bits of data. In other embodiments, the S-mode means each cell stores N bits of compressed data and the M-mode means each cell stores M bits of compressed data, where N is less than M. In one embodiment, accessing the memory device 14 in the S-mode provides a significant improvement in performance as compared to accessing the memory device 14 in the M-mode.

Figure 3:
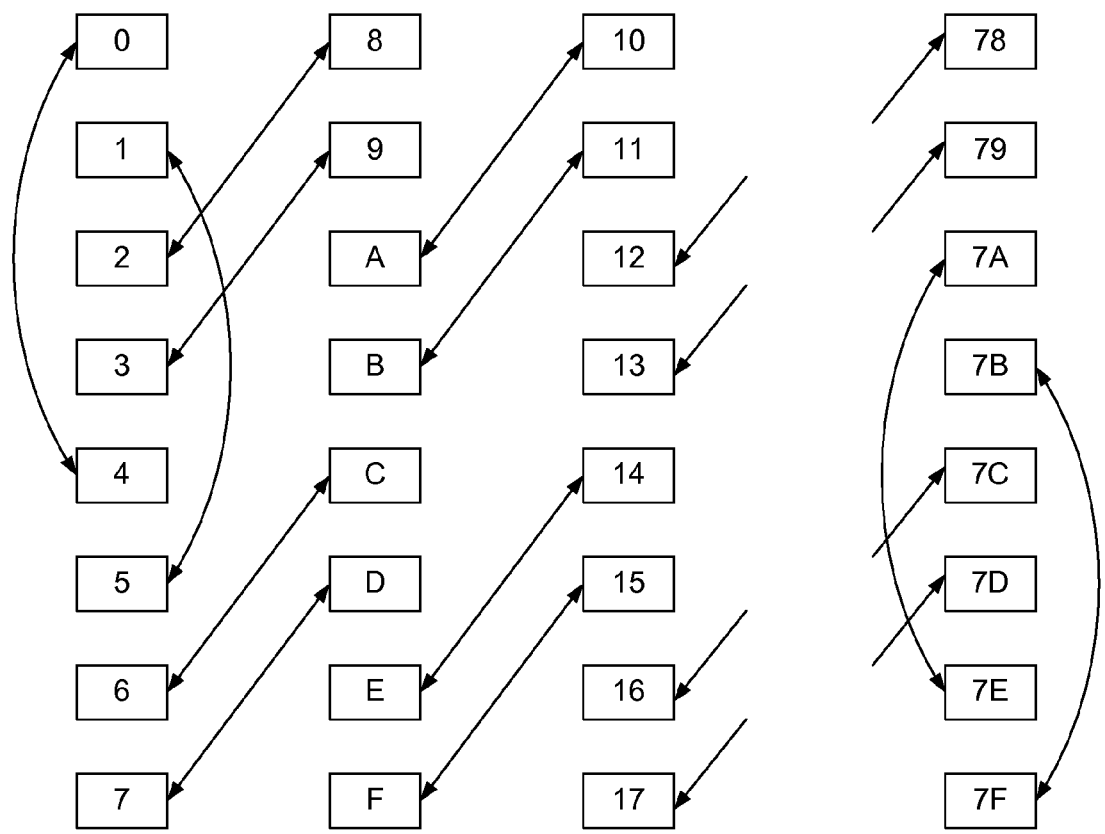
FIG. 3 shows a mapping of paired pages in a block of memory according to an embodiment of the present invention.

Any suitable mapping scheme may be employed to combined pages to generate paired pages within the memory array. In one embodiment, the memory array comprises a plurality of blocks each having a plurality of pages, wherein the pages of a block are erased together by erasing the entire block. In this embodiment, the pages within each block are paired using any suitable mapping scheme. FIG. 3 shows a mapping scheme according to an embodiment of the present invention wherein each block comprises 128 pages (00h-7Fh) such that there are 64 paired sets of pages in each block.

In one embodiment, each page in each block is accessed through a physical address. For example, the first page of a pair may be assigned the physical address 0xAF404C1 and the second page of a pair may be assigned the physical address 0xAF404C2. When the memory device 14 receives a write command to write to the first page (address 0xAF404C1), the memory device 14 writes the data to both the first and second page. In the example shown in FIG. 2B, the memory device 14 writes one bit of data to each cell of both pages in an S-mode. If the memory device receives a read command to read the first page (address 0xAF404C1), the data is read from both pages in the S-mode. If the memory device 14 subsequently receives a write command to write to the second page (address 0x0xAF404C2), the memory device 14 writes the data to both the first and second page. In the example shown in FIG. 2C, the memory device 14 writes another bit of data to each cell of both pages, thereby converting both pages to an M-mode (2 bits per cell in this example). If the memory device receives a read command to read either the first page (address 0xAF404C1) or the second page (address 0x0xAF404C2), the data is read from both pages in the M-mode. Any suitable memory device that operates in this manner, including any conventional memory device currently available on the market (e.g., a conventional flash memory having paired S-mode/M-mode pages), may be employed in the embodiments of the present invention.

Figure 4A:
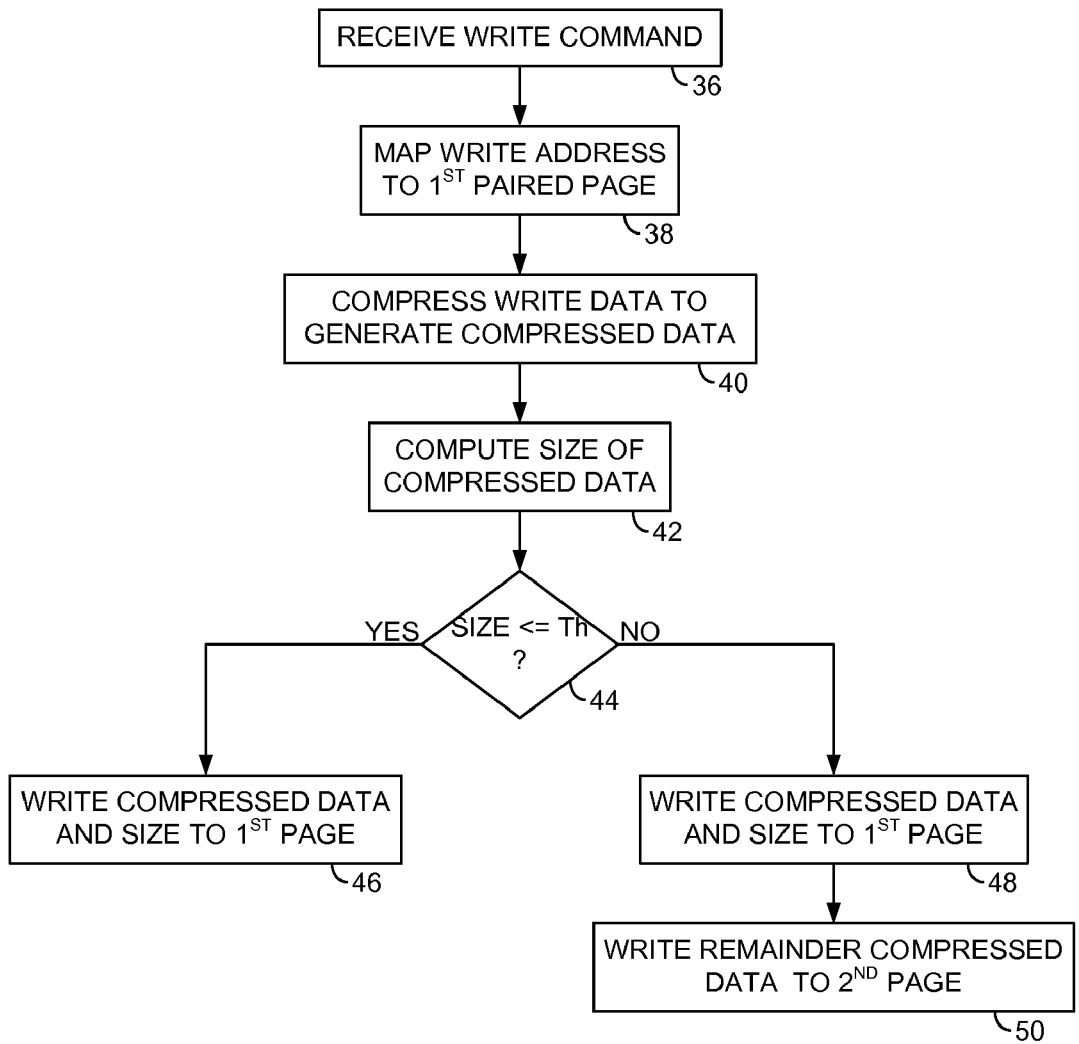
FIG. 4A is a flow diagram according to an embodiment of the present invention wherein when the compressed data fits into one of the paired pages, the compressed data is stored in both of the paired pages in an S-mode, otherwise the compressed data is stored in both of the paired pages in a M-mode.

FIG. 4A is a flow diagram according to an embodiment of the present invention wherein when the non-volatile semiconductor memory receives a write command from the host (step 36), the address of the write command is mapped to the physical address of the first paired page (step 38). The write data received from the host is compressed (step 40) and a size of the compressed data is computed (step 42). If the size of the compressed data is less than the size of a paired page (step 44), the compressed data is written to both paired pages in the S-mode (as described above) by writing to the physical address the first paired page (step 46). If the size of the compressed data is greater than the size of a paired page (step 44), the compressed data is written to both paired pages in the M-mode by first writing to the physical address of the first page (step 48) and then writing to the physical address of the second page (step 50). The first write operation writes data to the cells of both pages (e.g., a single bit as shown in FIG. 2B), and the second write operation writes the remaining data to the cells of both pages (e.g., another bit as shown in FIG. 2C).

Figure 4B:
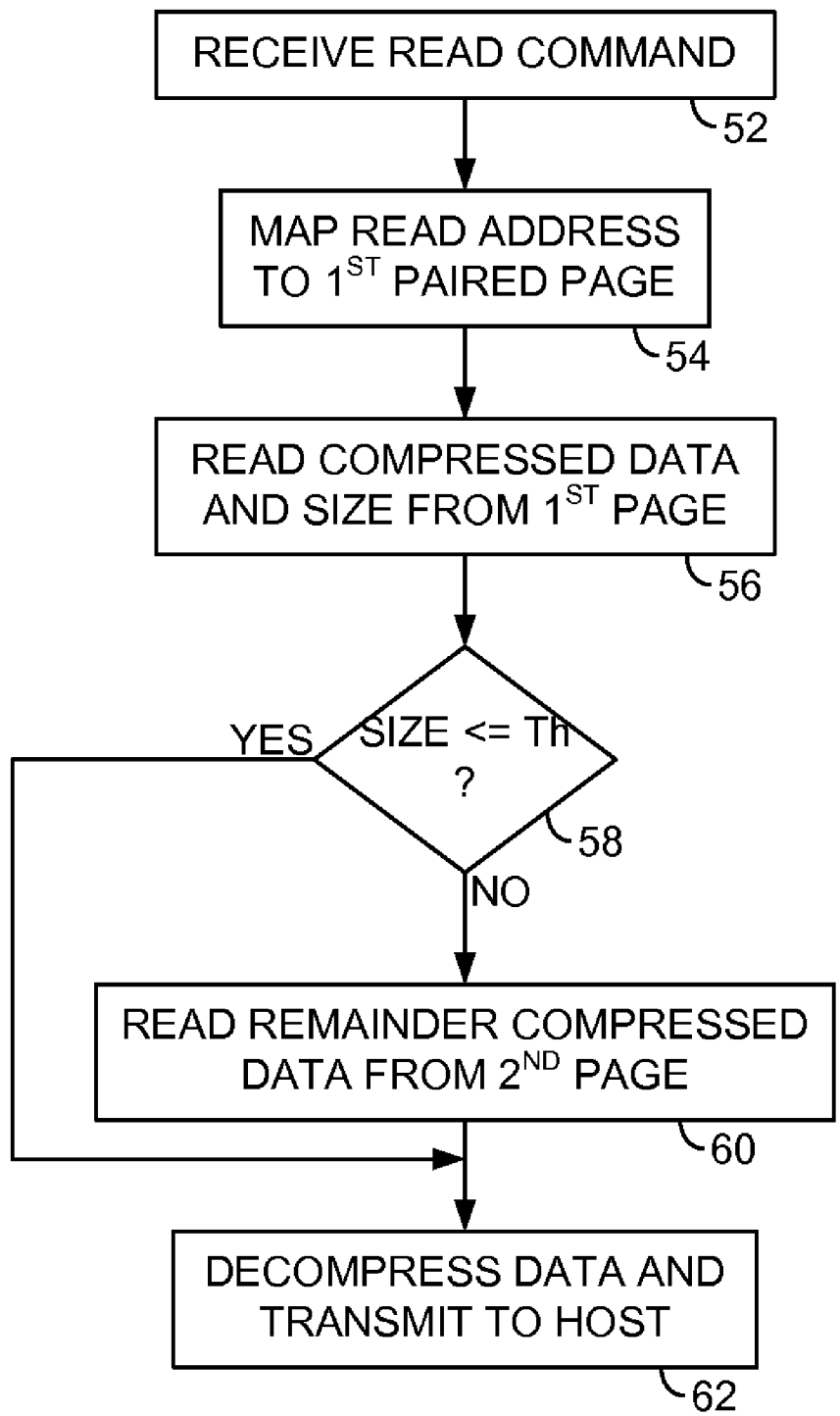
FIG. 4B shows a flow diagram according to an embodiment of the present invention wherein during a read command, the size of the compressed data determines whether the compressed data is read by reading one or both of the paired pages.

In the embodiment of FIG. 4A, the size of the compressed data is also written to the paired pages when processing a write command in order to determine the amount of data to read during a subsequent read command. This embodiment is understood with reference to the flow diagram of FIG. 4B wherein when the non-volatile semiconductor memory receives a read command from the host (step 52), the address of the read command is mapped to the physical address of the first page in the pair (step 54). The compressed data and size of the compressed data are then read from both the first and second paired pages by reading from the physical address of the first page (step 56). If the size of the compressed data is greater than the size of a paired page (step 58), the remaining compressed data is read from both the first and second paired pages by reading from the physical address of the second page (step 60). If the size of the compressed data is less than the size of a paired page (step 58), the data is read in the S-mode, otherwise the data is read in the M-mode. The compressed data is decompressed and transmitted to the host (step 62).

Figure 5A:
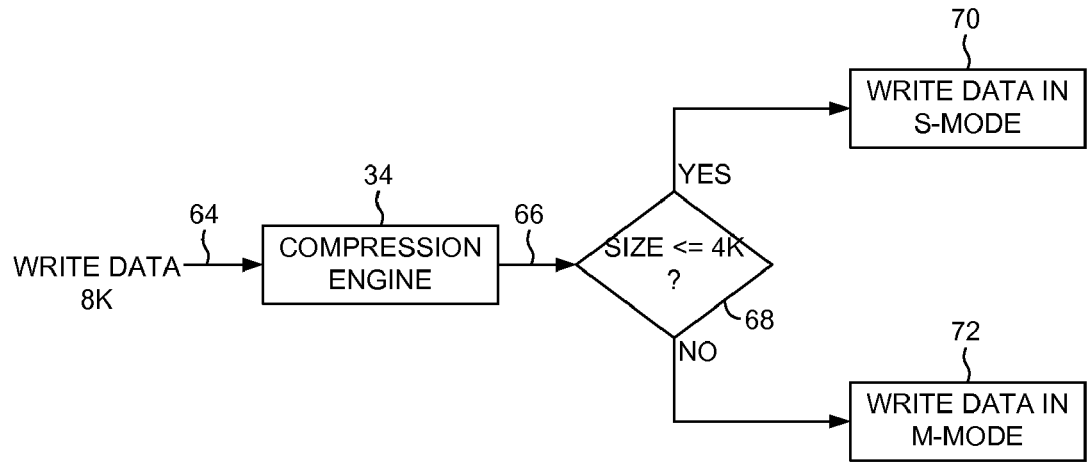
FIG. 5A shows an embodiment of the present invention wherein 8K data blocks are received in a write command and compressed into less than 4K for S-mode storage or more than 4K for M-mode storage.

FIG. 5A illustrates an example embodiment of the present invention wherein the non-volatile semiconductor memory 28 of FIG. 2A presents a data block size to the host of 8K bytes, and a number of logical block addresses equal to half the number of pages in the memory device 14. When a write command is received from the host to write an 8K data block 64, the compression engine 34 compresses the write data to generate compressed data 66. If the size of the compressed data is less than 4K bytes (step 68), the compressed data (including the size) is written to a paired set of pages in the S-mode as described above (i.e., each page stores 2K bytes). If the size of the compressed data is greater than 4K (step 68), then the compressed data (including the size) is written to the paired set of pages in the M-mode as described above (i.e., each page stores 4K bytes).

Figure 5B:
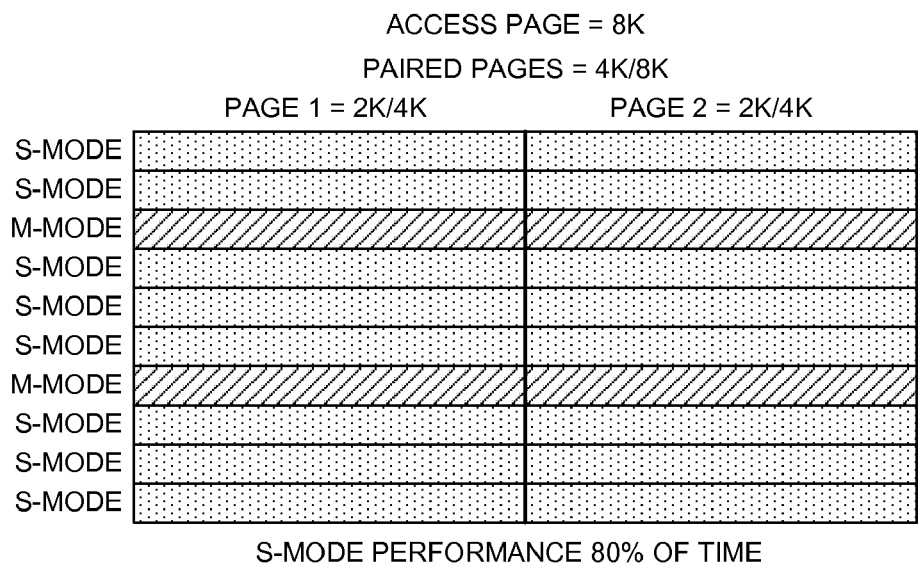
FIG. 5B illustrates an embodiment of the present invention wherein 80 percent of the compressed data is stored in S-mode and 20% of the compressed data is stored in M-mode.

In the example of FIG. 5A, a paired set of pages is able to store up to 4K of data in SLC-mode and up to 8K of data in M-mode. Thus if the compression engine 34 is able to compress at a ratio of 2:1 or better, the write data received from the host can be stored using the better performance S-mode. In a typical application, the write data received from the host can be compressed better than 2:1, so the non-volatile semiconductor memory exhibits S-mode performance most of the time. FIG. 5B illustrates an example where the write data is compressed better than 2:1 eighty percent of the time (8 out of 10 paired pages exhibit S-mode performance).

Figure 6:
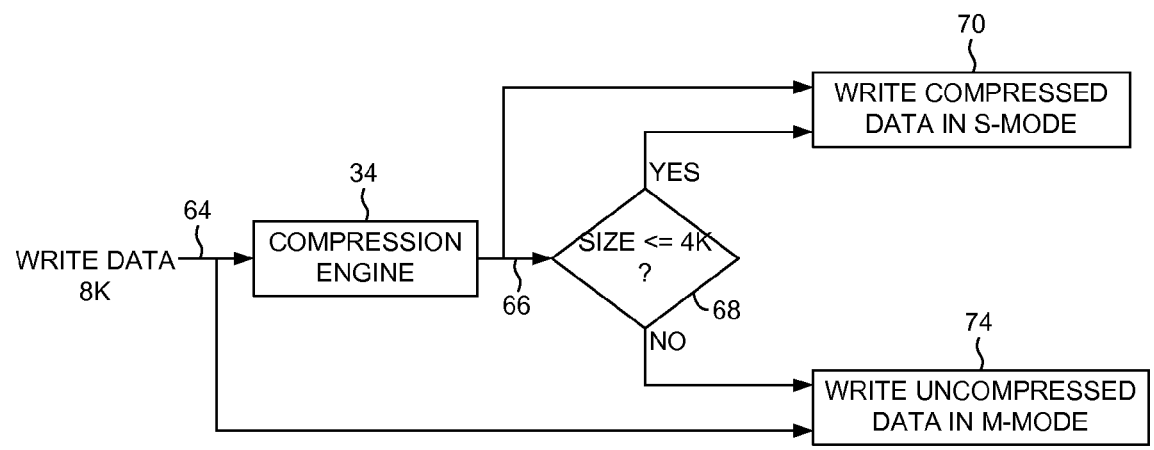
FIG. 6 illustrates an embodiment of the present invention wherein if the compressed data does not fit into one of the paired pages, the write data is stored uncompressed in the paired pages in the M-mode.

In one embodiment, the data is always compressed when written to the paired pages regardless of the size of the compressed data. In this embodiment, the compressed data is always decompressed when read from the paired pages. In an alternative embodiment illustrated in FIG. 6, if the compressed data 66 does not fit into one of the paired pages at step 68 (e.g., if the S-mode cannot be used), then the write data is stored in the paired pages uncompressed 64 (step 74). In the latter embodiment it is not necessary to decompress the data read from the paired pages during a read operation, which may improve performance if the decompression adds access latency. In addition, this embodiment may be necessary if the compression algorithm periodically generates more compressed data than the original write data. In yet another embodiment, part of the write data may be stored compressed (e.g., when writing to the physical address of the first page) and part of the write data may be stored uncompressed (e.g., when writing to the physical address of the second page). During a read operation, the paired pages may store an identifier (e.g., a flag) indicating whether the data is stored in a compressed or uncompressed format.

Figure 7:
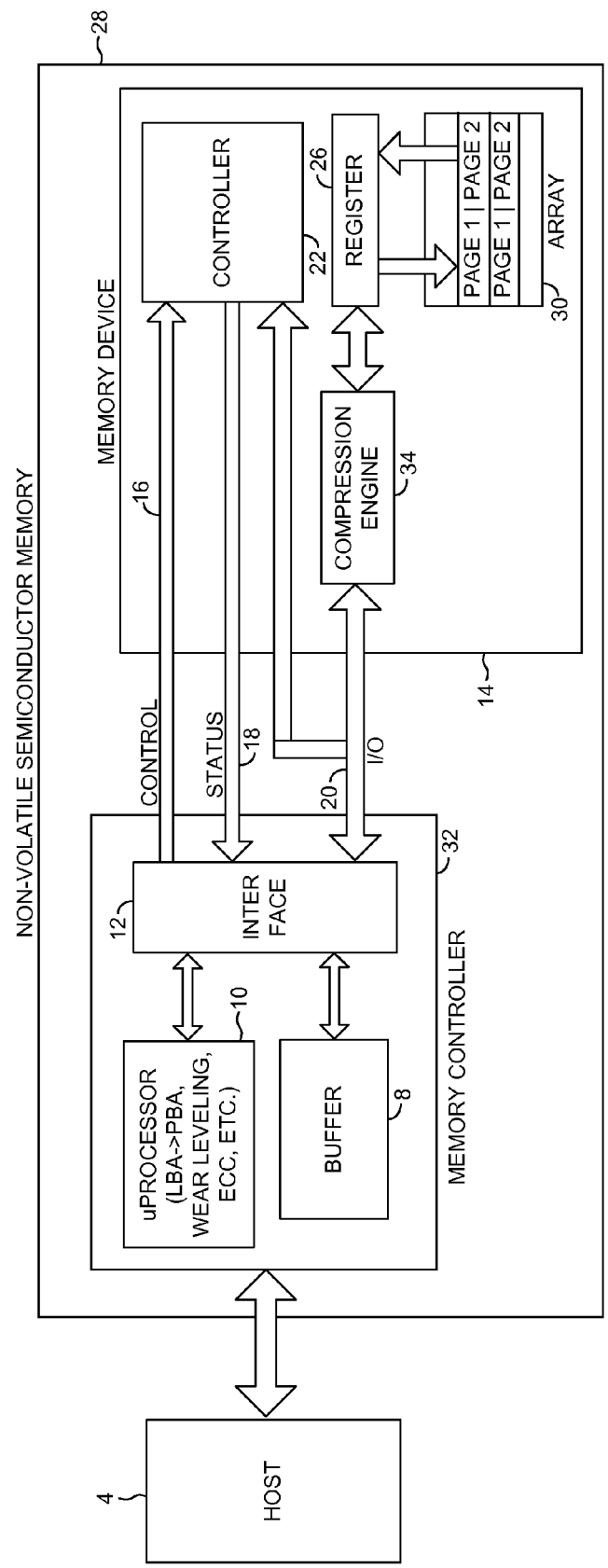
FIG. 7 shows a non-volatile semiconductor memory according to an embodiment of the present invention wherein the compression engine is implemented as part of the memory device.

The compression engine 34 in the embodiment of FIG. 2A may be implemented in any suitable manner, such as in firmware executed by the microprocessor 10, or in hardware independent of the microprocessor 10, or a combination of both. In one embodiment, the compression engine 34 operates fast enough so as to add little or no access latency (i.e., operates on-the-fly). In addition, the compression engine 34 may be implemented in any suitable location within the non-volatile semiconductor memory 28. In an embodiment shown in FIG. 7, the compression engine 34 may be implemented as part of the memory device 14 (e.g., as part of a flash memory). In this embodiment, the controller 22 in the memory device 14 may also determine the size of the compressed data to determine whether the compressed data is stored in S-mode or in M-mode, and therefore whether to write/read the physical address of one or both paired pages.

What is claimed is:

1. A non-volatile semiconductor memory comprising:
   a plurality of paired pages, wherein each pair comprises a first page and a second page; and
   control circuitry operable to:
      receive a write command from a host comprising write data and a write address;
      map the write address to a physical address of a selected one of the paired memory pages;
      compress the write data to generate compressed data; and
      when the compressed data fits in one of the pages of the selected pair, store the compressed data in the first page and in the second page of the selected pair in an S-mode.

2. The non-volatile semiconductor memory as recited in claim 1, wherein when the compressed data does not fit in one of the pages of the selected pair, the control circuitry is further operable to store the compressed data in the first page and in the second page of the selected pair in an M-mode.

3. The non-volatile semiconductor memory as recited in claim 1, wherein:
   the first and second page of the selected pair comprises a plurality of cells; and
   each cell stores a single bit in the S-mode.

4. The non-volatile semiconductor memory as recited in claim 2, wherein:
   the first and second page of the selected pair comprises a plurality of cells; and
   each cell stores multiple bits in the M-mode.

5. The non-volatile semiconductor memory as recited in claim 1, wherein the compressed data further comprises a size parameter of the compressed data.

6. The non-volatile semiconductor memory as recited in claim 5, wherein the control circuitry is further operable to:
   receive a read command from the host comprising a read address;
   map the read address to one of the paired pages;
   read the size parameter from the paired pages; and
   when the size parameter indicates the compressed data did not fit into one of the paired pages, read the compressed data from the first and second pages.

7. The non-volatile semiconductor memory as recited in claim 1, wherein when the compressed data does not fit in one of the pages of the selected pair, the control circuitry is further operable to store the write data in the first page and in the second page of the selected pair in an M-mode.

8. A method of operating a non-volatile semiconductor memory comprising a plurality of paired pages, wherein each pair comprises a first page and a second page, the method comprising:
   receiving a write command from a host comprising write data and a write address;
   mapping the write address to a physical address of a selected one of the paired memory pages;
   compressing the write data to generate compressed data; and
   when the compressed data fits in one of the pages of the selected pair, storing the compressed data in the first page and in the second page of the selected pair in an S-mode.

9. The method as recited in claim 8, wherein when the compressed data does not fit in one of the pages of the selected pair, further comprising storing the compressed data in the first page and in the second page of the selected pair in an M-mode.

10. The method as recited in claim 8, wherein:
    the first and second page of the selected pair comprises a plurality of cells; and
    each cell stores a single bit in the S-mode.

11. The method as recited in claim 9, wherein:
    the first and second page of the selected pair comprises a plurality of cells; and
    each cell stores multiple bits in the M-mode.

12. The method as recited in claim 8, wherein the compressed data further comprises a size parameter of the compressed data.

13. The method as recited in claim 12, further comprising:
    receiving a read command from the host comprising a read address;
    mapping the read address to one of the paired pages;
    reading the size parameter from the paired pages; and
    when the size parameter indicates the compressed data did not fit into one of the paired pages, reading the compressed data from the first and second pages.

14. The method as recited in claim 8, wherein when the compressed data does not fit in one of the pages of the selected pair, further comprising storing the write data in the first page and in the second page of the selected pair in an M-mode.

* * * * *